(12) United States Patent
Aoyama et al.

(10) Patent No.: US 9,769,880 B2
(45) Date of Patent: Sep. 19, 2017

(54) SEMICONDUCTOR MANUFACTURING METHOD AND SEMICONDUCTOR MANUFACTURING APPARATUS

(71) Applicant: SCREEN Holdings Co., Ltd., Kyoto (JP)

(72) Inventors: Takayuki Aoyama, Kyoto (JP); Shinichi Kato, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/751,309

(22) Filed: Jun. 26, 2015

(65) Prior Publication Data
US 2016/0079085 A1 Mar. 17, 2016

(30) Foreign Application Priority Data
Sep. 12, 2014 (JP) .................................. 2014-185838

(51) Int. Cl.
*H01L 21/425* (2006.01)
*H05B 3/00* (2006.01)
(Continued)

(52) U.S. Cl.
CPC ....... *H05B 3/0047* (2013.01); *H01L 21/0485* (2013.01); *H01L 21/28512* (2013.01);
(Continued)

(58) Field of Classification Search
CPC .. H01L 21/046; H01L 21/3247; H01L 21/324
See application file for complete search history.

(56) References Cited

U.S. PATENT DOCUMENTS 7,414,268 B2   8/2008  Ryu et al.
7,981,780 B2   7/2011  Kato .............................. 438/522
(Continued)

FOREIGN PATENT DOCUMENTS

JP   2002-270823 A   9/2002
JP   2007-059794 A   3/2007
(Continued)

OTHER PUBLICATIONS

Jul. 15, 2016 Taiwanese Office Action with partial English translation based on the Japanese translation of same.
(Continued)

*Primary Examiner* — Selim Ahmed
*Assistant Examiner* — Evan Clinton
(74) *Attorney, Agent, or Firm* — Ostrolenk Faber LLP

(57) ABSTRACT

Flash light is emitted from flash lamps to the surface of a semiconductor substrate on which a metal layer has been formed for one second or less to momentarily raise temperature on the surface of the semiconductor substrate including the metal layer and an impurity region to a processing temperature of 1000° C. or more. Heat treatment is performed by emitting flash light to the surface of the semiconductor substrate in a forming gas atmosphere containing hydrogen. By heating the surface of the semiconductor substrate to a high temperature in the forming gas atmosphere for an extremely short time period, contact resistance can be reduced without desorbing hydrogen taken in the vicinity of an interface of a gate oxide film for hydrogen termination.

10 Claims, 14 Drawing Sheets

(51) Int. Cl.
*H01L 21/04* (2006.01)
*H01L 21/67* (2006.01)
*H01L 21/687* (2006.01)
*H01L 21/285* (2006.01)

(52) U.S. Cl.
CPC .. *H01L 21/67115* (2013.01); *H01L 21/67248* (2013.01); *H01L 21/68785* (2013.01)

(56) References Cited

U.S. PATENT DOCUMENTS

| | | | |
|---|---|---|---|
| 8,664,116 B2 | 3/2014 | Fuse et al. | 438/660 |
| 8,859,443 B2 | 10/2014 | Yokouchi | |
| 2002/0102358 A1 | 8/2002 | Das et al. | |
| 2003/0013280 A1* | 1/2003 | Yamanaka | C23C 16/24 438/487 |
| 2003/0193066 A1* | 10/2003 | Ito | H01L 21/26506 257/335 |
| 2005/0023567 A1* | 2/2005 | Nishinohara | H01L 29/6659 257/204 |
| 2006/0261347 A1 | 11/2006 | Ryu et al. | |
| 2007/0099404 A1* | 5/2007 | Govindaraju | H01L 21/26506 438/520 |
| 2007/0235757 A1* | 10/2007 | Agarwal | H01L 29/0804 257/187 |
| 2008/0090369 A1* | 4/2008 | Akiyama | H01L 21/28518 438/308 |
| 2009/0275212 A1 | 11/2009 | Kato | 438/769 |
| 2009/0291518 A1* | 11/2009 | Kim | H01L 33/0079 438/33 |
| 2011/0018005 A1 | 1/2011 | Nakano | 257/77 |
| 2012/0238110 A1 | 9/2012 | Yokouchi | |
| 2013/0078802 A1 | 3/2013 | Fuse et al. | 438/660 |

FOREIGN PATENT DOCUMENTS

| | | |
|---|---|---|
| JP | 2007-281318 A | 10/2007 |
| JP | 2009-272402 A | 11/2009 |
| JP | 2013-84901 A | 5/2013 |
| JP | 2014-041901 | 3/2014 |
| TW | 200701454 | 1/2007 |
| TW | 201237964 | 9/2012 |

OTHER PUBLICATIONS

Korean Office Action dated Nov. 22, 2016 in corresponding Korean Application No. 10-2015-0108665 with Japanese translation of the Korean Office Action and with partial English translation of the Korean Office Action based on the Japanese translation of same.
Korean Office Action (Application No. 10-2015-0108665) dated May 29, 2017 with English partial translation based on the Japanese translation.

* cited by examiner

F I G. 4
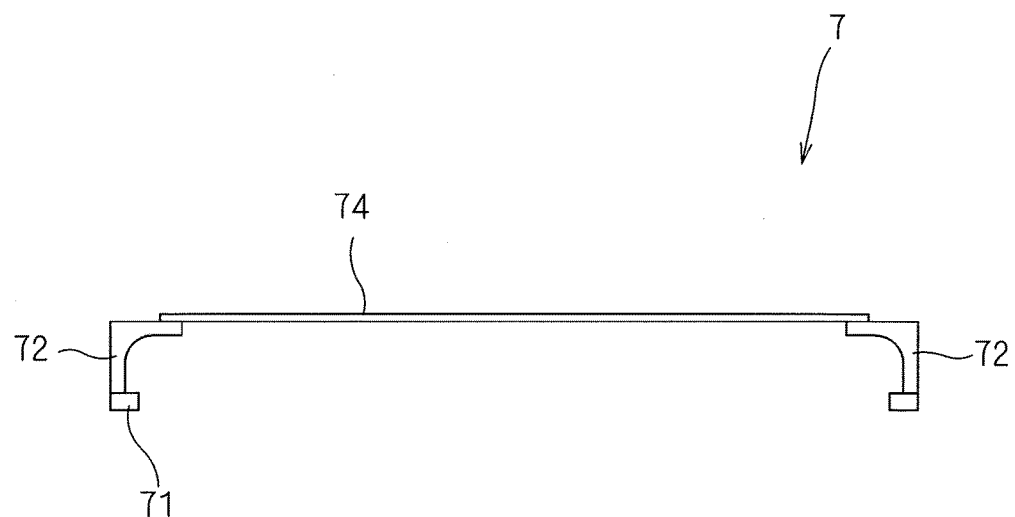

F I G. 5
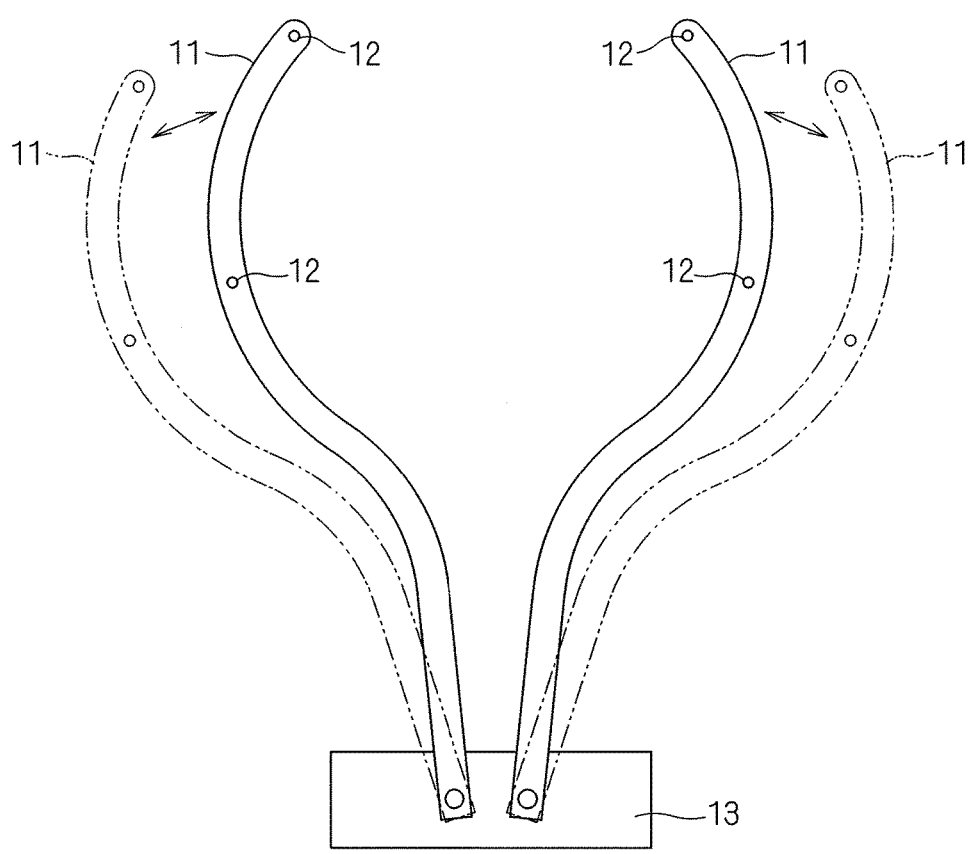

F I G . 1 0
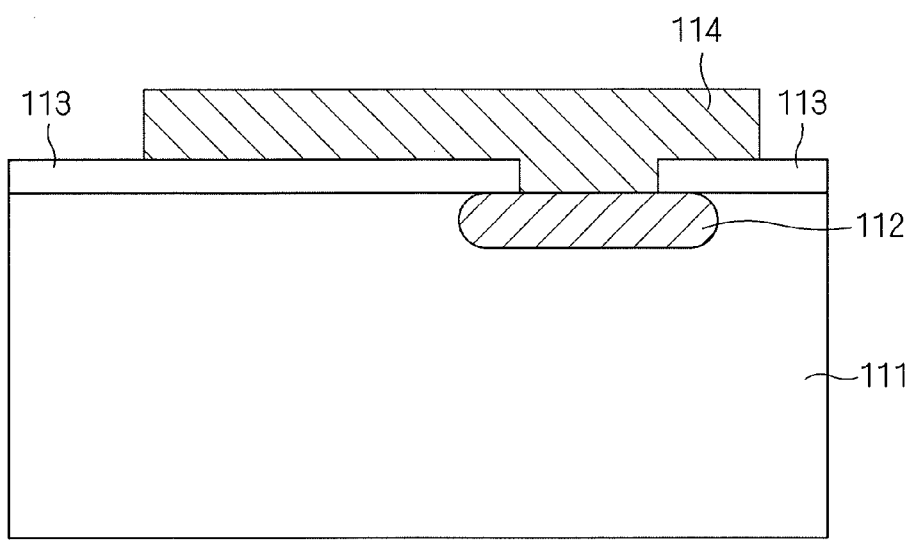

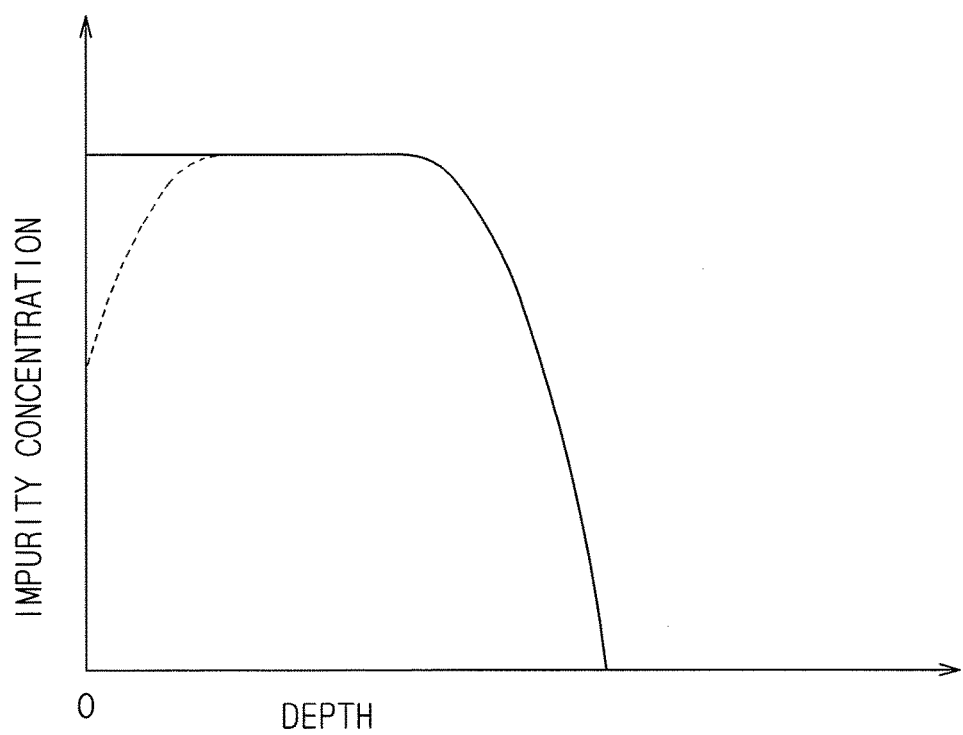
F I G . 1 1

SEMICONDUCTOR MANUFACTURING METHOD AND SEMICONDUCTOR MANUFACTURING APPARATUS

BACKGROUND OF THE INVENTION

Field of the Invention

The present invention relates to a semiconductor manufacturing method and a semiconductor manufacturing apparatus for forming a contact electrically connecting an n-type region and a p-type region formed in a semiconductor substrate with a metal layer.

Description of the Background Art

Establishing semiconductor-metal ohmic junctions (contacts) is an important technique in the manufacture of semiconductor devices. As a method for forming a contact to a semiconductor substrate formed of silicon carbide (SiC) and the like, a method of depositing a metal material on a heavily-doped impurity region, and then performing heat treatment referred to as post-deposition annealing (PDA) to form a reaction layer is widely known. In the process of manufacturing semiconductor devices, heat treatment is performed for a variety of purposes other than contact formation, for example, for activation of implanted impurities (see US2011/0018005).

A typical example of conventional heat treatment is heating performed for about a few minutes in a furnace, as disclosed in US2011/0018005 and other documents. Heat treatment of rapidly heating a semiconductor substrate for about a few seconds with a halogen lamp and the like is also common.

Depending on the type of heat treatment, however, a longer treatment time, even if it is only a few seconds, can deteriorate other characteristics of a semiconductor device. For example, in heat treatment for forming a contact to an SiC semiconductor substrate, a higher heating temperature is preferred as contact resistance decreases with increasing heating temperature. An SiC semiconductor, however, has been hydrogen-terminated to improve interface characteristics of a gate oxide film, and, when the SiC semiconductor is heat-treated at a high temperature for a few seconds or more for contact formation, hydrogen taken in the vicinity of the interface is desorbed, resulting in deterioration of the interface characteristics. It is difficult to heat treat aluminum, which is used as a metal layer to form a p-type contact, at a high temperature in the first place as aluminum is a low-melting metal.

Heat treatment for activating impurities is typically performed after implantation of the impurities and before formation of a metal layer. When such heat treatment is performed at a high temperature for a few seconds or more, however, the implanted impurities disappear due to out diffusion, and the impurity concentration decreases near the surface of the impurity region, making it difficult to obtain a low contact resistance.

SUMMARY OF THE INVENTION

The present invention is directed to a semiconductor manufacturing method for forming a contact to a semiconductor substrate.

In one aspect of the present invention, the semiconductor manufacturing method includes the steps of: (a) implanting ions into a region of the semiconductor substrate to form an impurity region; (b) forming a metal layer on the impurity region; and (c) emitting light to the semiconductor substrate on which the metal layer has been formed for one second or less for heating, wherein the step (c) is performed in a forming gas atmosphere containing hydrogen.

The temperature on the surface of the semiconductor substrate can be raised without desorbing hydrogen taken for hydrogen termination, and a low contact resistance can be obtained without deteriorating device characteristics.

In the step (c), the light emitted to the semiconductor substrate preferably has such spectral distribution that intensity at a wavelength of 300 nm relative to intensity at a wavelength of 500 nm is 20% or more.

Even a semiconductor substrate having a wide band gap can absorb the emitted light.

The semiconductor manufacturing method preferably further includes the step of forming a light absorbing film on the metal layer before the step (c).

This increases the absorption rate of the emitted light.

The present invention is also directed to a semiconductor manufacturing apparatus for forming a contact to a semiconductor substrate.

In one aspect of the present invention, the semiconductor manufacturing apparatus includes: a chamber for housing a semiconductor substrate including an impurity region which is implanted with ions and on which a metal layer has been formed; a susceptor installed in the chamber to support the semiconductor substrate to be placed thereon; a forming gas supply unit forming, in the chamber, a forming gas atmosphere containing hydrogen; and a light emitting unit emitting light to the semiconductor substrate to be supported by the susceptor for one second or less for heating in the forming gas atmosphere.

The temperature on the surface of the semiconductor substrate can be raised without desorbing hydrogen taken for hydrogen termination, and a low contact resistance can be obtained without deteriorating device characteristics.

The light emitted by the light emitting unit to the semiconductor substrate preferably has such spectral distribution that intensity at a wavelength of 300 nm relative to intensity at a wavelength of 500 nm is 20% or more.

Even a semiconductor substrate having a wide band gap can absorb the emitted light.

A light absorbing film has preferably been formed on the metal layer formed on the semiconductor substrate to which the light is emitted by the light emitting unit.

This increase the absorption rate of the emitted light.

The objective of the present invention is therefore to obtain a low contact resistance without deteriorating the device characteristics.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a side view of the holder;

FIG. 5 is a plan view of a transfer mechanism;

FIG. 10 shows a surface structure of the semiconductor substrate on which a metal layer has been formed;

FIG. 11 shows the impurity concentration in an impurity region after ion implantation;

DESCRIPTION OF THE PREFERRED EMBODIMENTS

The following describes embodiments of the present invention in details with reference to the drawings.

Embodiment 1

Figure 1:
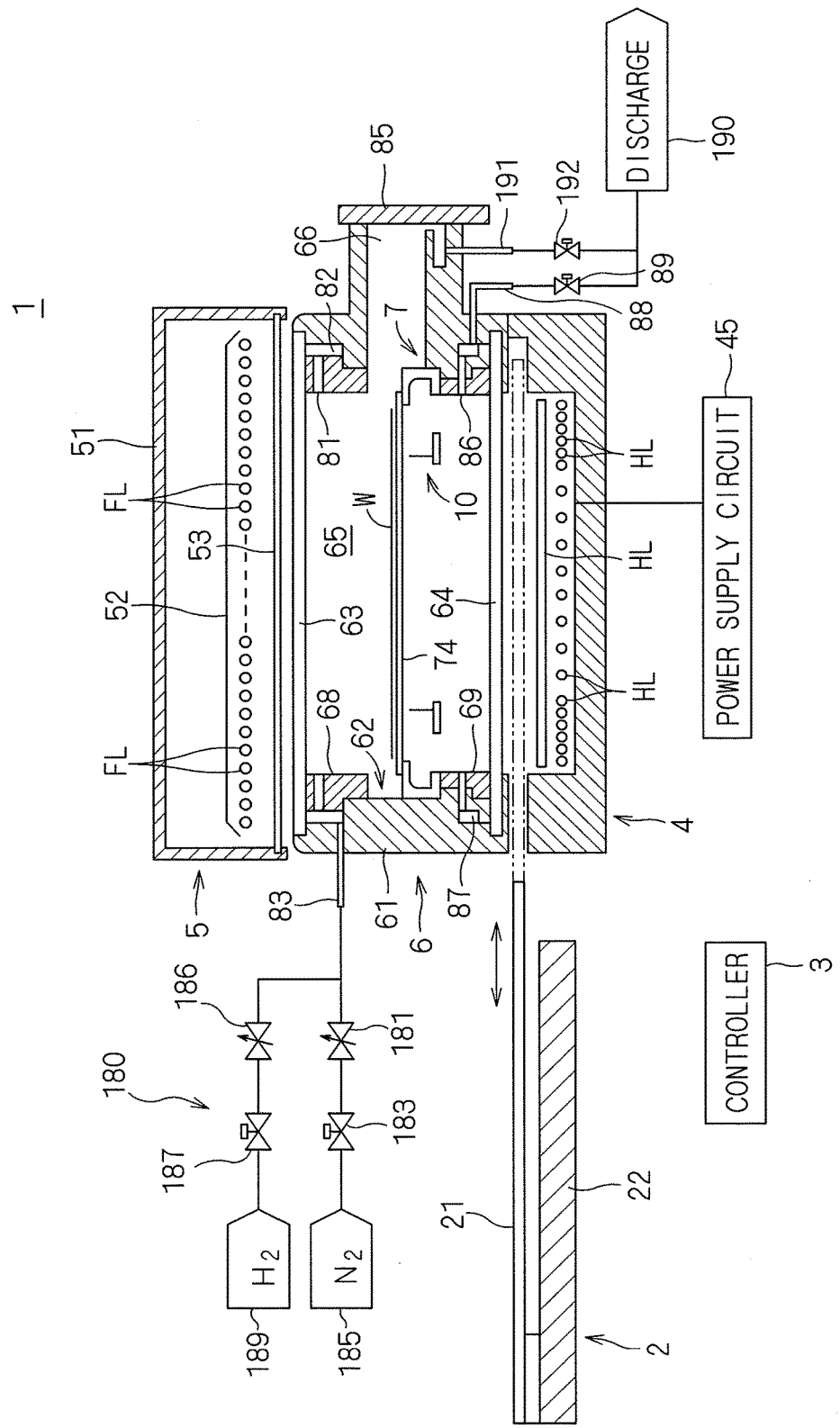
FIG. 1 is a vertical cross section showing the structure of a semiconductor manufacturing apparatus according to the present invention.

FIG. 1 is a vertical cross section showing the structure of a semiconductor manufacturing apparatus 1 according to the present invention. The semiconductor manufacturing apparatus 1 in the present embodiment is a flash lamp annealing apparatus that emits flash light to a semiconductor substrate W formed of silicon carbide (SiC) to perform post-deposition annealing (PDA) for contact formation. Although details are described later, a metal layer has been formed on an impurity region of the semiconductor substrate W before the semiconductor substrate W is transported into the semiconductor manufacturing apparatus 1, and a contact is formed between the metal layer and the impurity region by heat treatment performed by the semiconductor manufacturing apparatus 1.

The semiconductor manufacturing apparatus 1 includes a chamber 6 for housing the semiconductor substrate W, a flash heater 5 incorporating a plurality of flash lamps FL, a halogen heater 4 incorporating a plurality of halogen lamps HL, and a shutter mechanism 2. The flash heater 5 is provided above the chamber 6, and the halogen heater 4 is provided below the chamber 6. The semiconductor manufacturing apparatus 1 includes, inside the chamber 6, a holder 7 and a transfer mechanism 10. The holder 7 holds the semiconductor substrate W in a horizontal position. The transfer mechanism 10 transfers the semiconductor substrate W between the holder 7 and the outside of the apparatus. The semiconductor manufacturing apparatus 1 also includes a forming gas supply mechanism 180 forming a forming gas (hydrogen-nitrogen mixed gas) atmosphere inside the chamber 6. The semiconductor manufacturing apparatus 1 further includes a controller 3 controlling operating mechanisms provided to the shutter mechanism 2, the forming gas supply mechanism 180, the halogen heater 4, the flash heater 5, and the chamber 6 to cause them to heat treat the semiconductor substrate W.

The chamber 6 includes a cylindrical chamber side part 61 and chamber windows that are formed of quartz and have been attached to upper and lower ends of the chamber side part 61. The chamber side part 61 has a substantially cylindrical shape with its upper and lower ends open. An upper chamber window 63 has been attached to the upper opening of the chamber side part 61 so that the upper opening is closed, and a lower chamber window 64 has been attached to the lower opening of the chamber side part 61 so that the lower opening is closed. The upper chamber window 63 serving as the ceiling of the chamber 6 is a disk-shaped member formed of quartz, and functions as a quartz window that transmits flash light emitted from the flash heater 5 into the chamber 6. The lower chamber window 64 serving as the floor of the chamber 6 is also a disk-shaped member formed of quartz, and functions as a quartz window that transmits light from the halogen heater 4 into the chamber 6. In particular, the upper chamber window 63, which transmits the flash light into the chamber 6, is formed of synthetic quartz having a high transmittance in an ultraviolet region with a wavelength of 300 nm or less.

A reflective ring 68 and a reflective ring 69 have respectively been attached to an upper portion and a lower portion of the inner wall of the chamber side part 61. The reflective rings 68 and 69 are each annular. The reflective ring 68 in the upper portion has been fitted from above the chamber side part 61 to be attached. On the other hand, the reflective ring 69 in the lower portion has been fitted from below the chamber side part 61 and fastened with a screw (not illustrated) to be attached. This means that each of the reflective rings 68 and 69 has detachably been attached to the chamber side part 61. A space inside the chamber 6, namely a space enclosed by the upper chamber window 63, the lower chamber window 64, the chamber side part 61, and the reflective rings 68 and 69, is defined as a heat treatment space 65.

By attaching the reflective rings 68 and 69 to the chamber side part 61, a recess 62 is formed in the inner wall of the chamber 6. That is to say, the recess 62 enclosed by a middle portion, of the inner wall of the chamber side part 61, to which the reflective rings 68 and 69 have not been attached, a lower end surface of the reflective ring 68, and an upper end surface of the reflective ring 69 is formed. The recess 62 has an annular shape in a horizontal direction of the inner wall of the chamber 6, and surrounds the holder 7, which holds the semiconductor substrate W.

The chamber side part 61 and the reflective rings 68 and 69 are formed of a high-strength high-heat-resistant metal material (e.g., stainless steel). Inner circumferences of the reflective rings 68 and 69 have been electro nickel plated so as to be mirror surfaces.

The chamber side part 61 has a transportation opening (throat) 66 through which the semiconductor substrate W is transported into or out of the chamber 6. The transportation opening 66 can be opened and closed by a gate valve 85. The transportation opening 66 is connected to an outer circumference of the recess 62 so that the transportation opening 66 and the recess 62 communicate with each other. As a result, when the gate valve 85 opens the transportation opening 66, the semiconductor substrate W can be transported into or out of the heat treatment space 65 from the transportation opening 66 through the recess 62. When the gate valve 85 closes the transportation opening 66, the heat treatment space 65 inside the chamber 6 is made to be an enclosed space.

The chamber 6 has, in the upper portion of the inner wall thereof, a gas supply hole 81 through which a predetermined gas is supplied to the heat treatment space 65. The gas supply hole 81 is provided above the recess 62, and may be provided in the reflective ring 68. The gas supply hole 81 communicates with a gas supply pipe 83 through a buffer space 82 formed inside the side wall of the chamber 6 in an annular shape. The gas supply pipe 83 is divided into two paths. One of the paths is connected to a nitrogen gas supply source 185, and the other one of the paths is connected to a hydrogen gas supply source 189. As for the two paths of the gas supply pipe 83, a valve 183 and a flow rate regulating valve 181 are provided along a pipe connected to the nitrogen gas supply source 185, and a valve 187 and a flow rate regulating valve 186 are provided along a pipe connected to the hydrogen gas supply source 189.

When the valve 183 is opened, nitrogen gas ($N_2$) is supplied from the nitrogen gas supply source 185 to the buffer space 82 through the gas supply pipe 83. The flow rate of the nitrogen gas flowing through the gas supply pipe 83 is regulated by the flow rate regulating valve 181. When the valve 187 is opened, hydrogen gas ($H_2$) is supplied from the hydrogen gas supply source 189 to the buffer space 82 through the gas supply pipe 83. The flow rate of the hydrogen gas flowing through the gas supply pipe 83 is regulated by the flow rate regulating valve 186. The gas flowed into the buffer space 82, which has a lower fluid resistance than the gas supply hole 81, flows inside the buffer space 82 so as to diffuse, and is supplied to the heat treatment space 65 through the gas supply hole 81.

The forming gas supply mechanism 180 includes the nitrogen gas supply source 185, the valve 183, the flow rate regulating valve 181, the hydrogen gas supply source 189, the valve 187, the flow rate regulating valve 186, the gas supply pipe 83, the buffer space 82, and the gas supply hole 81. By opening both of the valves 183 and 187, a mixed gas (forming gas) of the hydrogen gas and the nitrogen gas can be supplied to the chamber 6 to form the forming gas atmosphere. The forming gas supplied by the forming gas supply mechanism 180 to the chamber 6 contains hydrogen of approximately 3 vol. %.

The chamber 6 also has, in the lower portion of the inner wall thereof, a gas discharge hole 86 through which gas in the heat treatment space 65 is discharged. The gas discharge hole 86 is provided below the recess 62, and may be provided in the reflective ring 69. The gas discharge hole 86 communicates with a gas discharge pipe 88 through a buffer space 87 formed inside the side wall of the chamber 6 in an annular shape. The gas discharge pipe 88 is connected to a discharger 190. A valve 89 is provided along the gas discharge pipe 88. When the valve 89 is opened, gas in the heat treatment space 65 is discharged from the gas discharge hole 86 to the gas discharge pipe 88 through the buffer space 87. The gas supply hole 81 and the gas discharge hole 86 may be a plurality of gas supply holes 81 and a plurality of gas discharge holes 86 provided along the circumference of the chamber 6, and may each have a slit-like shape.

A gas discharge pipe 191 discharging gas in the heat treatment space 65 is also connected to a leading end of the transportation opening 66. The gas discharge pipe 191 is connected to the discharger 190 through a valve 192. By opening the valve 192, gas in the chamber 6 is discharged through the transportation opening 66.

Figure 2:
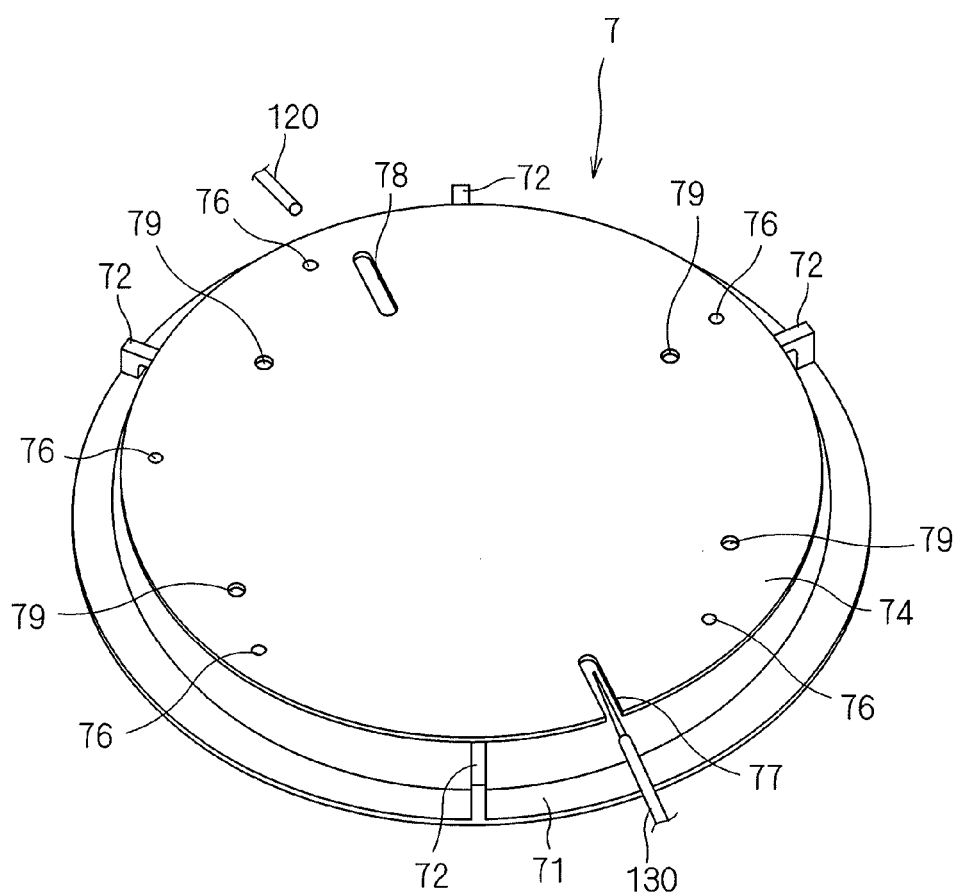
FIG. 2 is a perspective view showing overall appearance of a holder.
Figure 3:
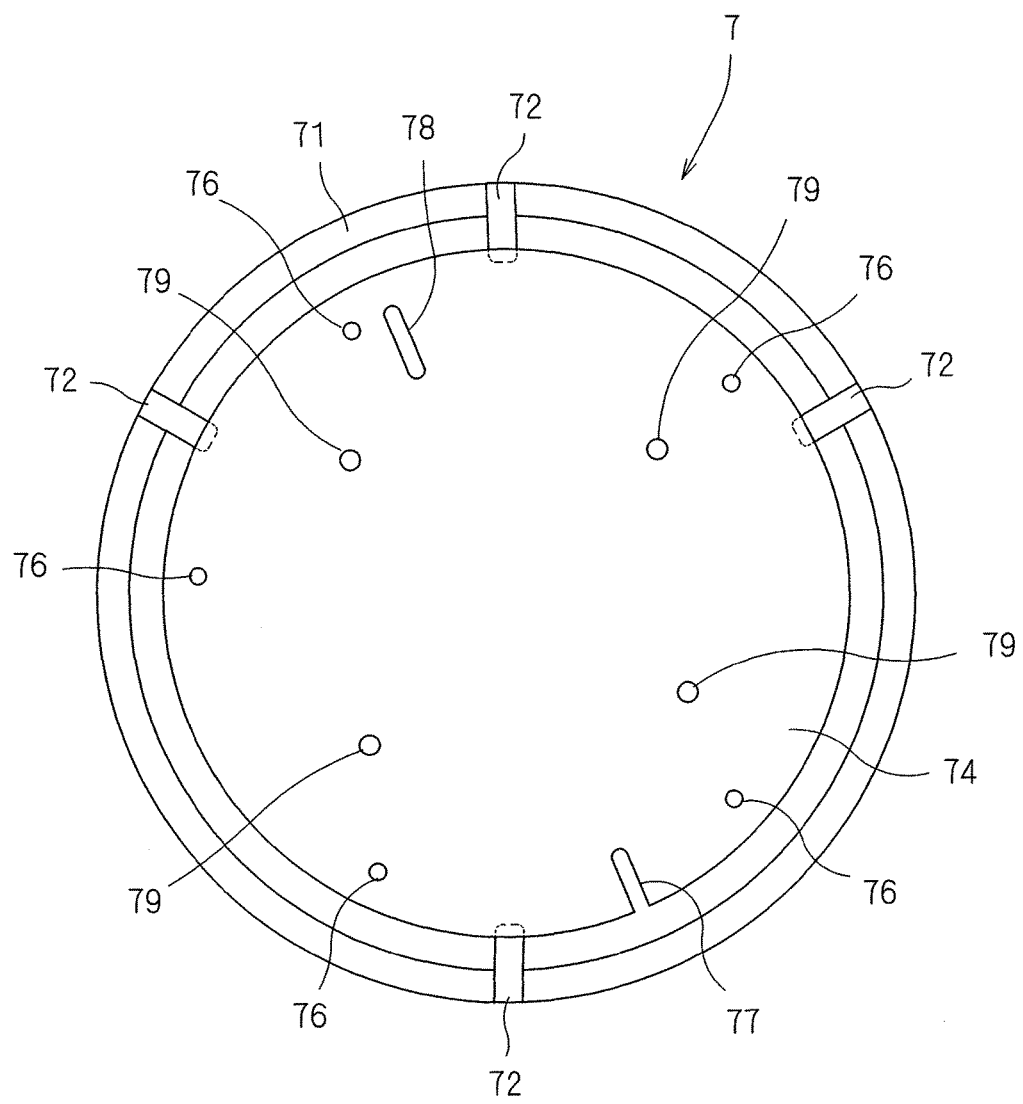
FIG. 3 is a top plan view of the holder.

FIG. 2 is a perspective view showing overall appearance of the holder 7. FIG. 3 is a top plan view of the holder 7, and FIG. 4 is a side view of the holder 7. The holder 7 includes a base ring 71, connectors 72, and a susceptor 74. The base ring 71, the connectors 72, and the susceptor 74 are each formed of quartz. That is to say, the holder 7 as a whole is formed of quartz.

The base ring 71 is an annular quartz member. The base ring 71 is placed on a bottom surface of the recess 62, and is thereby supported by the wall of the chamber 6 (see FIG. 1). The connectors 72 (four connectors 72 in the present embodiment) are provided to stand on an upper surface of the base ring 71, which is annular, along the circumference of the base ring 71. The connectors 72 are also quartz members, and are fixed to the base ring 71 by welding. The base ring 71 may have an arc shape, which is a partially-missing annular shape.

The susceptor 74 has a plate-like shape, and is supported by the four connectors 72 provided on the base ring 71. The susceptor 74 is a substantially circular plate-like member formed of quartz. The susceptor 74 has a larger diameter than the semiconductor substrate W. That is to say, the susceptor 74 has a larger plane size than the semiconductor substrate W. A plurality of guide pins 76 (five guide pins 76 in the present embodiment) are provided to stand on an upper surface of the susceptor 74. The five guide pins 76 are provided along the circumference of a circle concentric with an outer circumference of the susceptor 74. The circle along which the five guide pins 76 are provided has a slightly larger diameter than the semiconductor substrate W. Each of the guide pins 76 is also formed of quartz. The guide pins 76 may integrally be formed with the susceptor 74 by processing a quartz ingot, or may be formed separately from the susceptor 74 and then attached to the susceptor 74 by welding or a similar method.

The four connectors 72 provided to stand on the base ring 71 are fixed to a lower surface of a periphery of the susceptor 74 by welding. That is to say, the susceptor 74 and the base ring 71 are fixedly connected to each other by the connectors 72, so that the holder 7 is an integrally-formed member formed of quartz. The base ring 71 of the holder 7 formed as described above is supported by the wall of the chamber 6, so that the holder 7 is attached to the chamber 6. The susceptor 74, which is substantially disk-shaped, is in the horizontal position (a position in which a normal to the susceptor 74 coincides with the vertical direction) while the holder 7 is attached to the chamber 6. The semiconductor substrate W transported into the chamber 6 is placed on the susceptor 74 of the holder 7 attached to the chamber 6, and is held in the horizontal position. The semiconductor substrate W is placed inside the circle formed by the five guide pins 76 to prevent displacement of the semiconductor substrate W in the horizontal direction. The number of guide pins 76 is not limited to five, and may be any number as long as displacement of the semiconductor substrate W can be prevented.

As shown in FIGS. 2 and 3, the susceptor 74 has an opening 78 and a cut-out 77 each vertically penetrating the susceptor 74. The cut-out 77 is provided to allow a tip part of a probe of a contact thermometer 130 including a thermocouple to pass therethrough. The opening 78 is provided to allow a radiation thermometer 120 to receive light (infrared light) emitted from a lower surface of the semiconductor substrate W held by the susceptor 74. The susceptor 74 further has four through holes 79 through which lift pins 12 of the transfer mechanism 10, which is described later, pass to transfer the semiconductor substrate W.

Figure 6:
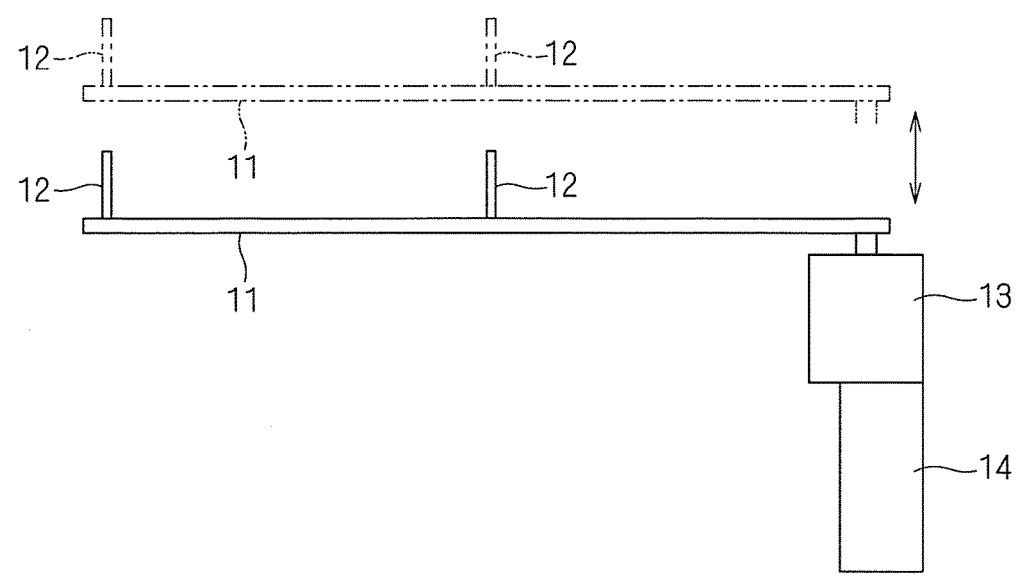
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 are each shaped like an arc substantially extending along the recess 62, which is annular. Two lift pins 12 are provided to stand on each of the transfer arms 11. Each of the transfer arms 11 is allowed to pivot by a horizontal movement mechanism 13. The horizontal movement mechanism 13 horizontally moves the pair of transfer arms 11 between a transfer operation position (shown in solid lines in FIG. 5) in which the pair of transfer arms 11 transfers the semiconductor substrate W to the holder 7 and a withdrawal position (shown in alternate long and two short dashes lines in FIG. 5) in which the pair of transfer arms 11 does not overlap the semiconductor substrate W held by the holder 7 in a plan view. The horizontal movement mechanism 13 may cause the transfer arms 11 to pivot individually with use of discrete motors, or may link the transfer arms 11 with use of a link mechanism and cause the transfer arms 11 to pivot in conjunction with each other with use of a single motor.

The pair of transfer arms 11 is moved upwards and downwards together with the horizontal movement mechanism 13 by a lifting mechanism 14. When the lifting mechanism 14 moves the pair of transfer arms 11 upwards in the transfer operation position, a total of four lift pins 12 pass through the through holes 79 (see FIGS. 2 and 3) provided in the susceptor 74, and upper ends of the lift pins 12 protrude from the upper surface of the susceptor 74. On the other hand, when the lifting mechanism 14 moves the pair of transfer arms 11 downwards in the transfer operation position to extract the lift pins 12 from the through holes 79, and the horizontal movement mechanism 13 moves the pair of transfer arms 11 so as to open the transfer arms 11, the transfer arms 11 move to the withdrawal position. The withdrawal position of the pair of transfer arms 11 is directly above the base ring 71 of the holder 7. Since the base ring 71 is placed on the bottom surface of the recess 62, the withdrawal position of the transfer arms 11 is in the recess 62. A discharge mechanism, which is not shown, is provided near a driving unit (the horizontal movement mechanism 13 and the lifting mechanism 14) of the transfer mechanism 10, and discharges an atmosphere around the driving unit of the transfer mechanism 10 to the outside of the chamber 6.

Referring back to FIG. 1, the flash heater 5 provided above the chamber 6 includes a housing 51, and a light source and a reflector 52 that are housed in the housing 51. The light source includes a plurality of xenon flash lamps FL (30 xenon flash lamps FL in the present embodiment). The reflector 52 is provided to cover the light source from above. A lamp light emitting window 53 has been attached to the bottom of the housing 51 of the flash heater 5. The lamp light emitting window 53 serving as the floor of the flash heater 5 is a plate-like quartz window. The lamp light emitting window 53 is also formed of synthetic quartz as with the upper chamber window 63. Since the flash heater 5 is provided above the chamber 6, the lamp light emitting window 53 and the upper chamber window 63 face each other. The flash lamps FL emit flash light to the heat treatment space 65 from above the chamber 6 through the lamp light emitting window 53 and the upper chamber window 63.

The flash lamps FL are each a rod-like lamp having a long cylindrical shape, and are two-dimensionally arranged so that longitudinal directions of the flash lamps FL are parallel to each other along a main surface of the semiconductor substrate W held by the holder 7 (i.e., along a horizontal plane). A plane formed by arrangement of the flash lamps FL is thus also a horizontal plane.

Figure 8:
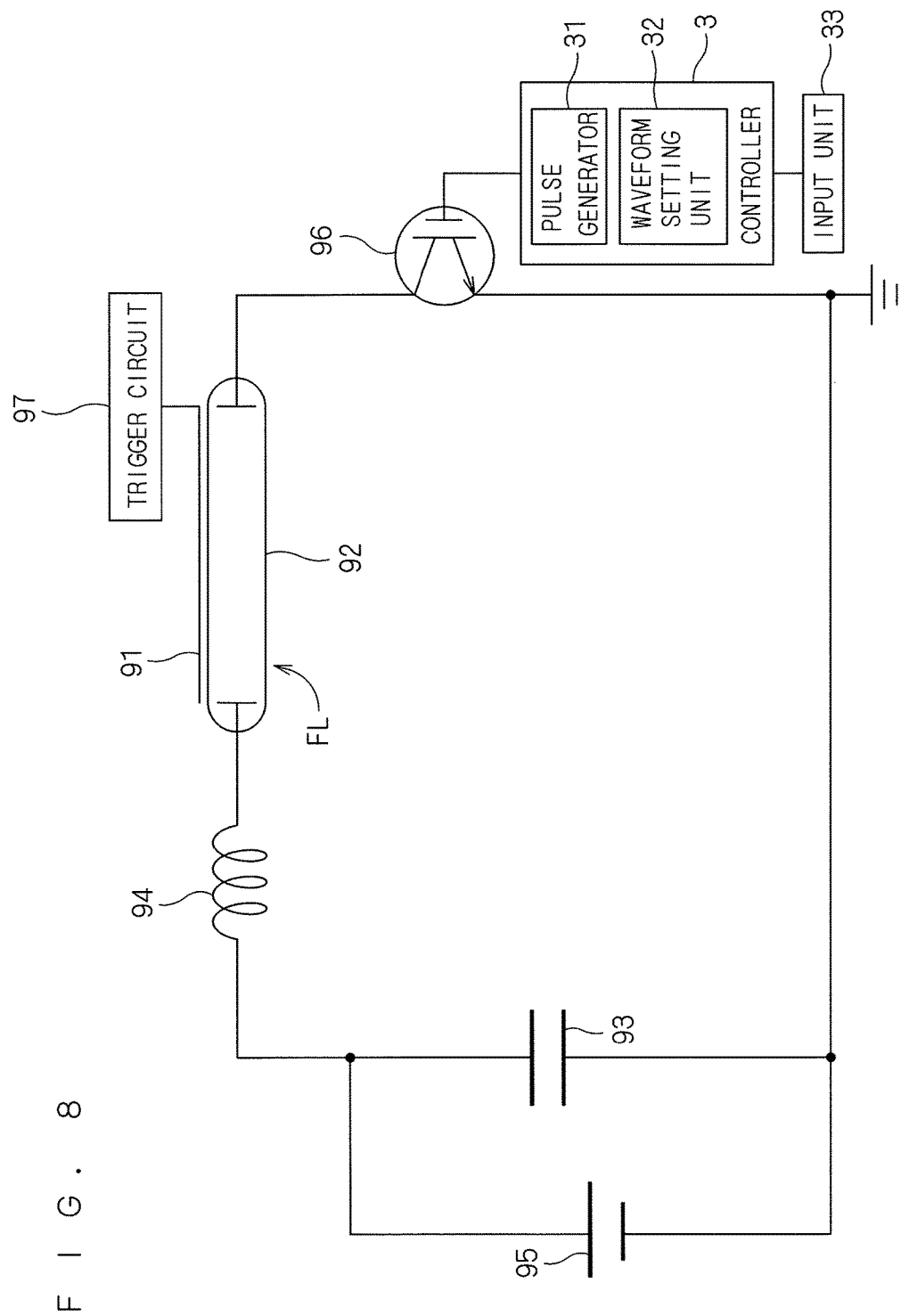
FIG. 8 shows a drive circuit for driving a flash lamp.

FIG. 8 shows a drive circuit for driving a flash lamp FL. As shown in FIG. 8, a capacitor 93, a coil 94, the flash lamp FL, and an insulated-gate bipolar transistor (IGBT) 96 are connected in series. As shown in FIG. 8, the controller 3 includes a pulse generator 31 and a waveform setting unit 32, and is connected to an input unit 33. Various known input devices, such as a keyboard, a mouse, and a touch panel, can be used as the input unit 33. The waveform setting unit 32 sets a waveform of a pulse signal based on input from the input unit 33, and the pulse generator 31 generates the pulse signal in accordance with the waveform.

The flash lamp FL includes a rod-like glass tube (discharge tube) 92 and a trigger electrode 91. The glass tube 92 is filled with xenon gas, and includes an anode and a cathode at respective ends thereof. The trigger electrode 91 is provided on an outer circumference of the glass tube 92. A power supply unit 95 applies a predetermined voltage to the capacitor 93, and the capacitor 93 is charged in accordance with the applied voltage (a charging voltage). A trigger circuit 97 can apply a high voltage to the trigger electrode 91. A timing at which the trigger circuit 97 applies a voltage to the trigger electrode 91 is controlled by the controller 3.

The IGBT 96 is a bipolar transistor incorporating a metal oxide semiconductor field effect transistor (MOSFET) in a gate part, and is a switching element suitable for handling high power. The pulse signal generated by the pulse generator 31 of the controller 3 is applied to the gate of the IGBT 96. The IGBT 96 is switched on when a voltage (high voltage) that is equal to or higher than a predetermined value is applied to the gate of the IGBT 96, and is switched off when a voltage (low voltage) that is lower than the predetermined value is applied to the gate of the IGBT 96. As such, the drive circuit including the flash lamp FL is switched on and off by the IGBT 96. By switching the IGBT 96 on and off, connection between the flash lamp FL and the capacitor 93 corresponding to the flash lamp FL is intermitted.

When a high voltage is applied to the electrodes at respective ends of the glass tube 92 by switching on the IGBT 96 in a state in which the capacitor 93 is charged, current does not flow through the glass tube 92 in a normal state as xenon gas is electrically an insulator. However, when the trigger circuit 97 applies a high voltage to the trigger electrode 91 to break down the insulation, current flows through the glass tube 92 instantaneously due to discharge between the electrodes at respective ends of the glass tube 92, and light is emitted by excitation of xenon atoms or molecules at the time.

Spectral distribution of light emitted from the xenon flash lamps FL ranges from an ultraviolet region to a near infrared region. In the present embodiment, the lamp light emitting window 53 and the upper chamber window 63, which transmit flash light from the flash lamps FL, are formed of synthetic quartz. The synthetic quartz has a high transmittance with respect to ultraviolet rays having a wavelength of 300 nm or shorter. As a result, flash light emitted from the flash lamps FL to the semiconductor substrate W in the chamber 6 has such spectral distribution that intensity at a wavelength of 300 nm relative to intensity at a wavelength 500 nm is 20% or more.

The reflector 52 shown in FIG. 1 is provided above the flash lamps FL so as to cover the flash lamps FL as a whole. A basic function of the reflector 52 is to reflect light emitted from the flash lamps FL towards the holder 7. The reflector 52 is formed by an aluminum alloy plate, and has a surface (a surface facing the flash lamps FL) roughened by blasting.

Figure 7:
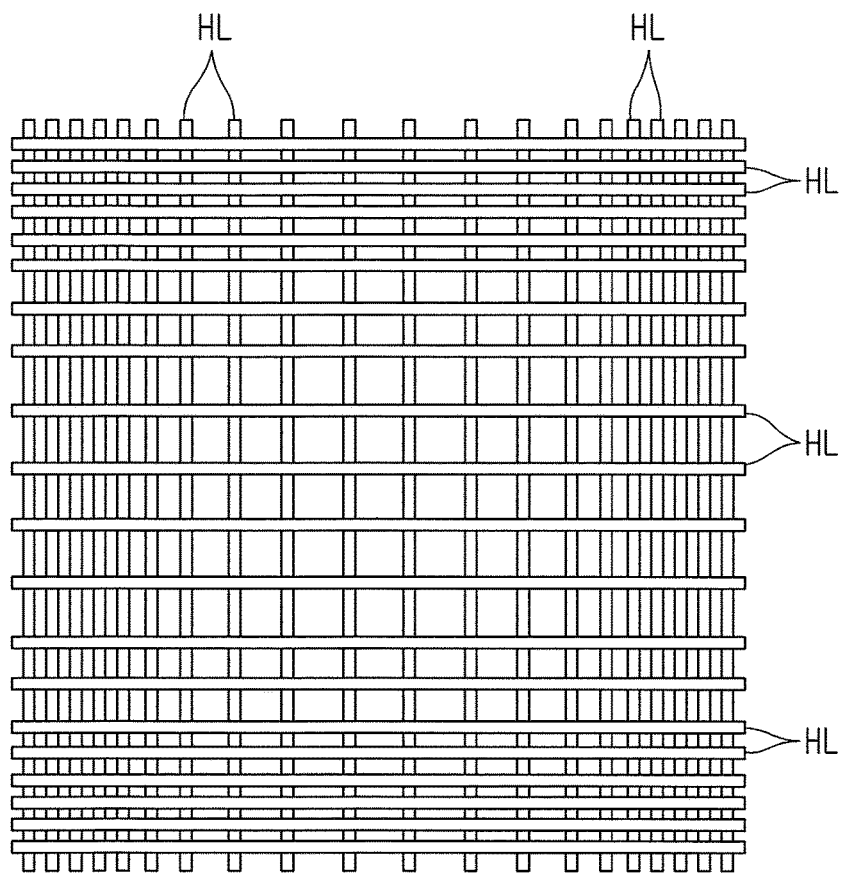
FIG. 7 is a plan view showing arrangement of a plurality of halogen lamps.

A plurality of halogen lamps HL (40 halogen lamps HL in the present embodiment) are incorporated in the halogen heater 4 provided below the chamber 6. The halogen lamps HL emit light when powered by a power supply circuit 45, and emit halogen light to the heat treatment space 65 from below the chamber 6 through the lower chamber window 64. Power supply from the power supply circuit 45 is controlled by the controller 3. FIG. 7 is a plan view showing arrangement of the halogen lamps HL. In the present embodiment, 20 halogen lamps HL are arranged in each of upper and lower tiers. The halogen lamps HL are each a rod-like lamp having a long cylindrical shape. In each of the upper and lower tiers, 20 halogen lamps HL are arranged so that longitudinal directions of the halogen lamps HL are parallel to each other along the main surface of the semiconductor substrate W held by the holder 7 (i.e., along a horizontal plane). A plane formed by arrangement of the halogen lamps HL is thus a horizontal plane in each of the upper and lower tiers.

As shown in FIG. 7, in the upper and lower tiers, the density of the arranged halogen lamps HL is higher in a region facing a periphery of the semiconductor substrate W held by the holder 7 than in a region facing the center of the semiconductor substrate W held by the holder 7. This means that, in the upper and lower tiers, spacing between the arranged halogen lamps HL is shorter in the periphery than in the center of lamp arrangement. This makes it possible to emit a larger amount of light to the periphery of the semiconductor substrate W, where the temperature is more likely to decrease during heating performed by emitting light from the halogen heater 4.

A group of halogen lamps HL in the upper tier and a group of halogen lamps HL in the lower tier are arranged so as to cross each other in a grid pattern. That is to say, a total of 40 halogen lamps HL are arranged such that the longitudinal directions of the halogen lamps HL in the upper tier and the longitudinal directions of the halogen lamps HL in the lower tier are perpendicular to each other.

The halogen lamp HL is a filament light source that emits light by allowing current to flow through a filament provided inside a glass tube so that the filament glows. The glass tube is filled with gas containing inert gas, such as nitrogen and argon, and a trace of halogen, such as iodine and bromine. Introduction of halogen makes it possible to set the temperature of the filament to a high temperature while suppressing breakage of the filament. The halogen lamp HL thus has a longer life than a typical incandescent lamp, and can continuously emit intense light. The halogen lamp HL has a long life as it is a rod-like lamp, and, by arranging the halogen lamps HL along a horizontal plane, efficiency of emitting light to the semiconductor substrate W provided above the halogen lamps HL is increased.

As shown in FIG. 1, the semiconductor manufacturing apparatus 1 includes the shutter mechanism 2 provided beside the halogen heater 4 and the chamber 6. The shutter mechanism 2 includes a shutter plate 21 and a slide drive mechanism 22. The shutter plate 21 is a plate opaque to halogen light, and is formed of titanium (Ti), for example. The slide drive mechanism 22 drives the shutter plate 21 to slide in the horizontal direction to thereby insert and withdraw the shutter plate 21 into and from a light-blocking position between the halogen heater 4 and the holder 7. When the slide drive mechanism 22 drives the shutter plate 21 to move forwards, the shutter plate 21 is inserted into the light-blocking position (shown in an alternate long and two short dashes line in FIG. 1) between the chamber 6 and the halogen heater 4, and the lower chamber window 64 and the halogen lamps HL are insulated from each other. As a result, light traveling from the halogen lamps HL towards the holder 7 in the heat treatment space 65 is blocked. On the other hand, when the slide drive mechanism 22 drives the shutter plate 21 to move backwards, the shutter plate 21 is withdrawn from the light-blocking position between the chamber 6 and the halogen heater 4, and the lower chamber window 64 is opened downwards.

The controller 3 controls the above-mentioned various operating mechanisms provided to the semiconductor manufacturing apparatus 1. The controller 3 has a similar hardware configuration to a typical computer. That is to say, the controller 3 includes a CPU performing various operations, ROM that is read-only memory for storing therein a basic program, RAM that is readable/writable memory for storing therein various information pieces, and a magnetic disk for storing therein control software, data, and the like. The CPU of the controller 3 runs a predetermined processing program, so that processing performed in the semiconductor manufacturing apparatus 1 progresses. As shown in FIG. 8, the controller 3 includes the pulse generator 31 and the waveform setting unit 32. As described above, the waveform setting unit 32 sets the waveform of the pulse signal based on the input from the input unit 33, and the pulse generator 31 outputs the pulse signal to the gate of the IGBT 96 in accordance with the waveform. The controller 3 further controls opening and closing of each of the valves of the forming gas supply mechanism 180 to control the atmosphere in the chamber 6, and controls the power supply circuit 45 to control light emission of the halogen lamps HL.

Other than the above-mentioned components, the semiconductor manufacturing apparatus 1 includes various components for cooling to prevent an excessive temperature rise of the halogen heater 4, the flash heater 5, and the chamber 6 caused by thermal energy generated from the halogen lamps HL and the flash lamps FL during heat treatment of the semiconductor substrate W. For example, a water-cooled tube (not shown) is provided in the wall of the chamber 6. The halogen heater 4 and the flash heater 5 are air-cooled by forming gas flow therein and discharging heat. Air is supplied to clearance between the upper chamber window 63 and the lamp light emitting window 53 to cool the flash heater 5 and the upper chamber window 63.

Figure 9:
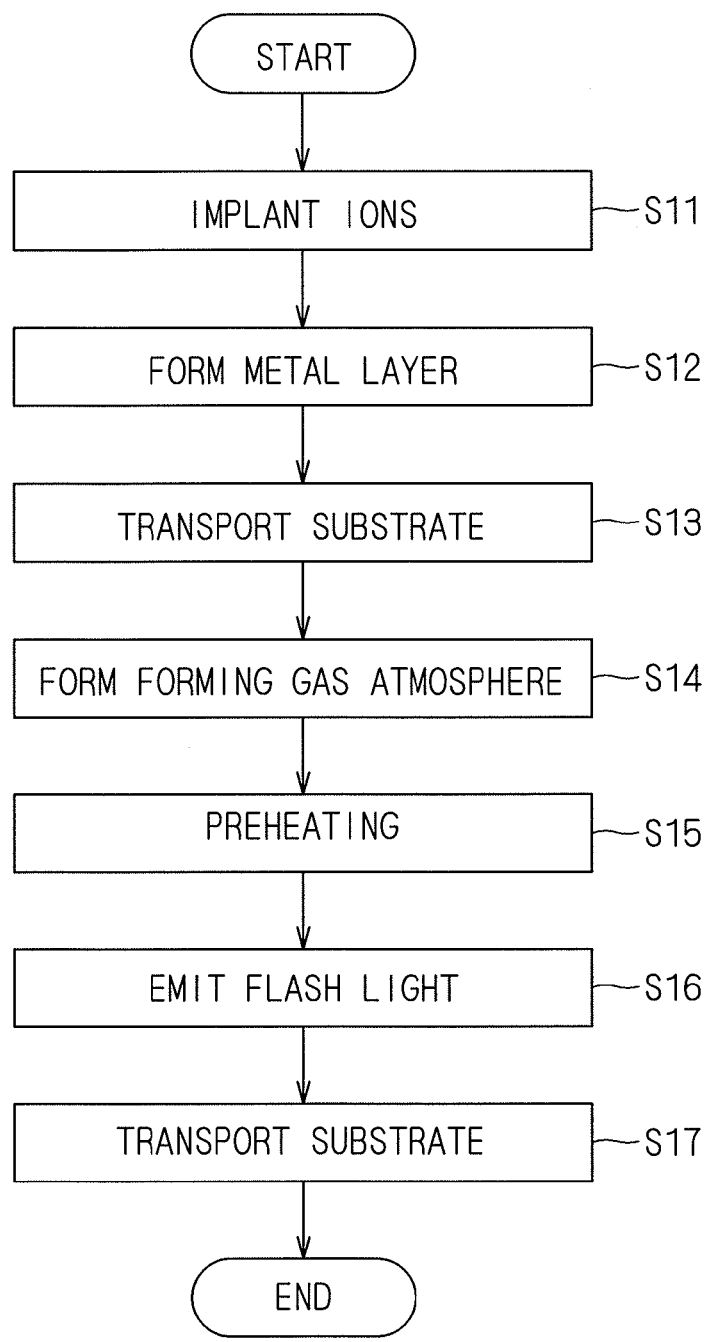
FIG. 9 is a flowchart showing the procedure for forming a contact to a semiconductor substrate.

The procedure for forming a contact to the semiconductor substrate W is described next. FIG. 9 is a flowchart showing the procedure for forming the contact to the semiconductor substrate W. Processing in and after step S13 in FIG. 9 is processing performed by the semiconductor manufacturing apparatus 1.

In the present embodiment, the semiconductor substrate W as a target for contact formation is an SiC substrate. SiC is known to have various crystal structures, such as a cubic crystal structure and a hexagonal crystal structure, but 4H—SiC, which has a hexagonal crystal structure, is preferred for a power device application. SiC has a wide band gap (approximately 3.2 eV in a case of 4H—SiC) and electric field breakdown strength that is approximately 10 times higher than that of silicon, and is expected to be a high-frequency power device material. The SiC semiconductor substrate W is a circular substrate having, for example, a diameter $\phi$ of 150 mm (6 inches) and a thickness of approximately 0.4 mm.

Prior to heat treatment performed by the semiconductor manufacturing apparatus 1, ions are implanted into a region of the semiconductor substrate W (step S11). The ions are implanted by an ion implantation apparatus installed separately from the semiconductor manufacturing apparatus 1 to form an impurity region by implanting a dopant (impurities) into the semiconductor substrate W. In implanting the ions, a silicon oxide film is formed on the surface of the semiconductor substrate W, and then only a region of the silicon oxide film is removed by photolithography and etching, for example. In the ion implanting process in step S11, the ions are implanted only into a region, of the semiconductor substrate W, in which the silicon oxide film has not been formed.

When the ion-implanted region (impurity region) of the semiconductor substrate W is a p-type region, aluminum ions ($Al^+$) are implanted, for example. On the other hand, when the ion-implanted region of the semiconductor substrate W is an n-type region, phosphorus ions ($P^+$) are implanted, for example. The ions may be implanted at room temperature or may be implanted at a high temperature (e.g., 500° C.). Ion implantation performed at a high temperature does not damage crystallinity of the implanted region of the semiconductor substrate W, but ion implantation performed at room temperature can destroy crystallinity of the implanted region of the semiconductor substrate W.

Next, in Embodiment 1, a metal layer is formed on the surface of the semiconductor substrate W without activating the implanted ions (step S12). Surface treatment of the semiconductor substrate W with use of chemical liquid, such as hydrofluoric acid, may be performed between the ion implanting process in step S11 and the metal layer forming process in step S12.

FIG. 10 shows a surface structure of the semiconductor substrate W on which the metal layer has been formed. An impurity region 112 has been formed in a part of an SiC base 111 of the semiconductor substrate W by ion implantation. A metal layer 114 has been formed on the impurity region 112. An interlayer insulating film 113 has been formed between the base 111 excluding the impurity region and the metal layer 114. The interlayer insulating film 113 is a silicon oxide ($SiO_2$) film, for example.

The metal layer 114 is formed by sputtering, for example. The method for forming the metal layer 114, however, is not limited to sputtering, and the metal layer 114 may be formed by deposition or a similar method. When the impurity region 112 of the semiconductor substrate W is a p-type impurity region, the metal layer 114 is formed of aluminum (Al), for example. When the impurity region 112 of the semiconductor substrate W is an n-type impurity region, the metal layer 114 is formed of nickel (Ni), for example.

Heat treatment (PDA) for reducing contact resistance between the metal layer 114 and the impurity region 112 is then performed by the semiconductor manufacturing apparatus 1. The following describes the procedure performed by the semiconductor manufacturing apparatus 1. The procedure performed by the semiconductor manufacturing apparatus 1 progresses by the controller 3 controlling the operating mechanisms of the semiconductor manufacturing apparatus 1.

The semiconductor substrate W including the impurity region 112 which is formed by ion implantation and on which the metal layer 114 has been formed is transported into the chamber 6 of the semiconductor manufacturing apparatus 1 (step S13). When the semiconductor substrate W is transported, the gate valve 85 is opened to open the transportation opening 66, and a transporting robot outside the apparatus transports the semiconductor substrate W on which the metal layer 114 has been formed to the heat treatment space 65 in the chamber 6 through the transportation opening 66. At this time, nitrogen gas may continuously be supplied into the chamber 6 by opening the valve 183, and may be allowed to flow out through the transportation opening 66 to minimize the flow of an atmosphere outside the apparatus into the chamber 6. The semiconductor substrate W transported by the transporting robot stops advancing when it reaches a position directly above the holder 7. The pair of transfer arms 11 of the transfer mechanism 10 then horizontally moves from the withdrawal position to the transfer operation position, and moves upwards, so that the lift pins 12 protrude from the upper surface of the susceptor 74 through the through holes 79 to receive the semiconductor substrate W.

After the semiconductor substrate W is placed on the lift pins 12, the transporting robot exits from the heat treatment space 65, and the transportation opening 66 is closed by the gate valve 85. The pair of transfer arms 11 then moves downwards, so that the semiconductor substrate W is transferred from the transfer mechanism 10 to the susceptor 74 of the holder 7, and held in the horizontal position. The semiconductor substrate W is held by the susceptor 74 with the surface on which the metal layer 114 has been formed as an upper surface. The semiconductor substrate W is held inside the five guide pins 76 on the upper surface of the susceptor 74. The pair of transfer arms 11 moved downwards to the position below the susceptor 74 is withdrawn by the horizontal movement mechanism 13 to the withdrawal position, i.e., the position in the recess 62.

After the semiconductor substrate W including the impurity region 112 which is formed by ion implantation and on which the metal layer 114 has been formed is housed in the chamber 6, the forming gas atmosphere is formed in the chamber 6 (step S14). Specifically, the mixed gas (forming gas) of the hydrogen gas and the nitrogen gas is supplied to the heat treatment space 65 through the gas supply hole 81 by opening the valves 183 and 187. As a result, the forming gas atmosphere is formed around the semiconductor substrate W held by the holder 7 in the chamber 6. The hydrogen gas concentration (i.e., the mixing ratio of the hydrogen gas to the nitrogen gas) in the forming gas atmosphere is regulated by the flow rate regulating valves 181 and 186. In the present embodiment, the flow rate regulating valve 186 and the flow rate regulating valve 181 respectively regulate the flow rate of the hydrogen gas and the flow rate of the nitrogen gas so that the hydrogen gas concentration in the forming gas atmosphere is approximately 3 vol. %.

At the same time as formation of the forming gas atmosphere in the chamber 6, 40 halogen lamps HL of the halogen heater 4 are switched on simultaneously to start preheating (assist heating) of the semiconductor substrate W (step S15). Halogen light emitted from the halogen lamps HL passes through the lower chamber window 64 and the susceptor 74, which are each formed of quartz, and is emitted to the semiconductor substrate W from a back surface thereof. The back surface of the semiconductor substrate W refers to a main surface of the semiconductor substrate W opposite to the surface on which the metal layer 114 has been formed. Upon receiving light emitted from the halogen lamps HL, the temperature of the semiconductor substrate W rises. The transfer arms 11 of the transfer mechanism 10 do not interfere with heating performed by the halogen lamps HL as they are withdrawn to the position in the recess 62.

The contact thermometer 130 measures the temperature of the semiconductor substrate W when the semiconductor substrate W is preheated by the halogen lamps HL. That is to say, the contact thermometer 130, which includes the thermocouple, is brought into contact with the lower surface of the semiconductor substrate W held by the susceptor 74 through the cut-out 77, and measures a rising temperature of the substrate. The measured temperature of the semiconductor substrate W is transmitted to the controller 3. The controller 3 controls output of the halogen lamps HL while monitoring the temperature of the semiconductor substrate W rising due to light emitted from the halogen lamps HL to see whether the temperature has reached a predetermined preheating temperature T1. That is to say, the controller 3 adjusts the intensity of the halogen lamps HL by performing feedback control over the power supply circuit 45 based on the value measured by the contact thermometer 130 so that the temperature of the semiconductor substrate W becomes the preheating temperature T1. The preheating temperature T1 in Embodiment 1 is 600° C., for example. The radiation thermometer 120 does not measure the temperature when the temperature of the semiconductor substrate W rises due to light emitted from the halogen lamps HL. This is because halogen light emitted from the halogen lamps HL strikes the radiation thermometer 120 as ambient light, and thus the temperature cannot accurately be measured.

After the temperature of the semiconductor substrate W reaches the preheating temperature T1, the controller 3 temporarily maintains the semiconductor substrate W at the preheating temperature T1. Specifically, when the temperature of the semiconductor substrate W measured by the contact thermometer 130 reaches the preheating temperature T1, the controller 3 controls the power supply circuit 45 to adjust the intensity of the halogen lamps HL, and maintains the semiconductor substrate W at approximately the preheating temperature T1.

The halogen lamps HL perform such preheating to uniformly raise the temperature of the semiconductor substrate W as a whole to the preheating temperature T1. At the stage of performing preheating with the halogen lamps HL, the temperature of the semiconductor substrate W tends to be lower in the periphery of the semiconductor substrate W, where heat is more likely to dissipate, than in the center of the semiconductor substrate W. However, the density of the halogen lamps HL arranged in the halogen heater 4 is higher in the region facing the periphery of the semiconductor substrate W than in the region facing the center of the semiconductor substrate W. Thus, a larger amount of light is emitted to the periphery of the semiconductor substrate W, where heat is more likely to dissipate, making temperature distribution in the surface of the semiconductor substrate W uniform at the preheating stage. Furthermore, since the inner circumference of the reflective ring 69 attached to the chamber side part 61 is a mirror surface, a larger amount of light is reflected by the inner circumference of the reflective ring 69 towards the periphery of the semiconductor substrate W, making temperature distribution in the surface of the semiconductor substrate W further uniform at the preheating stage.

Next, when a predetermined time has passed since the semiconductor substrate W reaching the preheating temperature T1, flash heat treatment is performed by emitting flash light from the flash lamps FL (step S16). In emitting flash light from the flash lamps FL, the power supply unit 95 stores in advance charge in the capacitor 93. In a state in which charge is stored in the capacitor 93, the pulse generator 31 of the controller 3 outputs the pulse signal to the IGBT 96 to perform on-off driving of the IGBT 96.

The waveform of the pulse signal can be defined by inputting, from the input unit 33, a recipe in which a time of the pulse width (on time) and a time of the pulse interval (off time) are sequentially set as parameters. When an operator inputs such a recipe from the input unit 33 to the controller 3, the waveform setting unit 32 of the controller 3 sets the pulse waveform that is repetition of the on time and the off time in accordance with the input recipe. The pulse generator 31 outputs the pulse signal in accordance with the pulse waveform set by the waveform setting unit 32. As a result, the pulse signal having the set waveform is applied to the gate of the IGBT 96, and on-off driving of the IGBT 96 is controlled. Specifically, the IGBT 96 is switched on when the pulse signal input into the gate of the IGBT 96 is on, and is switched off when the pulse signal is off.

In synchronization with the timing at which the pulse signal output from the pulse generator 31 is turned on, the controller 3 controls the trigger circuit 97 to apply a high voltage (trigger voltage) to the trigger electrode 91. By inputting the pulse signal to the gate of the IGBT 96 in the state in which charge is stored in the capacitor 93, and applying the high voltage to the trigger electrode 91 in synchronization with the timing at which the pulse signal is turned on, current surely flows between the electrodes at respective ends of the glass tube 92 when the pulse signal is on, and light is emitted by excitation of xenon atoms or molecules at the time.

The flash lamps FL emit light as described above, and flash light is emitted to the surface of the semiconductor substrate W held by the holder 7. Since the lamp light emitting window 53 and the upper chamber window 63, which transmit flash light from the flash lamps FL, are each formed of synthetic quartz, flash light emitted to the surface of the semiconductor substrate W held by the holder 7 has such spectral distribution that intensity at a wavelength of 300 nm relative to intensity at a wavelength 500 nm is 20% or more. When the flash lamp FL is caused to emit light without using the IGBT 96, charge stored in the capacitor 93 is consumed by single light emission, and output from the flash lamp FL has a waveform of a single pulse having a width of approximately 0.1 milliseconds to 10 milliseconds. In contrast, in the present embodiment, the IGBT 96, which is a switching element, is connected to the circuit, and the pulse signal is output to the gate of the IGBT 96, so that supply of charge from the capacitor 93 to the flash lamp FL is intermitted by the IGBT 96 to control current flowing through the flash lamp FL. As a result, light emission from the flash lamp FL is, so to say, chopper controlled, and charge stored in the capacitor 93 is consumed in multiple cycles and the flash lamp FL repeats flashing during an extremely short time period. The next pulse is applied to the gate of the IGBT 96 before the value of current flowing through the circuit completely becomes "0", and the value of the current increases again. Thus, output of emitted light does not completely become "0" even while the flash lamp FL repeats flashing. The light emitting pattern of the flash lamp FL can freely be defined, and the light emitting time and the light emitting intensity can freely be adjusted by the IGBT 96 intermitting supply of charge to the flash lamp FL. The flash lamp FL emits light for one second at the longest.

Flash light is emitted from the flash lamps FL to the surface of the semiconductor substrate W on which the metal layer 114 has been formed to momentarily raise the temperature on the surface of the semiconductor substrate W including the metal layer 114 and the impurity region 112 to a processing temperature T2. The processing temperature T2 is the highest temperature that the surface of the semiconductor substrate W reaches due to emission of flash light, is 1000° C. or more, and, for example, is 1200° C. in Embodiment 1. When the temperature on the surface of the semiconductor substrate W rises to the processing temperature T2 in the forming gas atmosphere, the reaction layer is formed at an interface between the metal layer 114 and the impurity region 112, and a contact is formed. Since flash light is emitted from the flash lamps FL for a short time period of one second or less, a time period required for the temperature on the surface of the semiconductor substrate W to rise from the preheating temperature TI to the processing temperature T2 is also an extremely short time period of less than one second.

When emission of flash light from the flash lamp FL ends, the IGBT 96 is switched off, light emission from the flash lamp FL stops, and the surface temperature of the semiconductor substrate W falls sharply from the target temperature T2. The halogen lamps HL are also switched off, and thus the temperature of the semiconductor substrate W falls from the preheating temperature T1. After heat treatment of the semiconductor substrate W ends, only the valve 187 is closed to replace the atmosphere in the chamber 6 with the nitrogen gas atmosphere. At the same time as switching-off of the halogen lamps HL, the shutter mechanism 2 inserts the shutter plate 21 into the light-blocking position between the halogen heater 4 and the chamber 6. The temperature of the filaments and the tube walls does not immediately decrease even when the halogen lamps HL are switched off, and radiation heat is temporarily released from the filaments and the tube walls that are at a high temperature, preventing falling of the temperature of the semiconductor substrate W. Radiation heat emitted from the halogen lamps HL immediately after switching-off to the heat treatment space 65 is insulated by insertion of the shutter plate 21, leading to an increase in the speed at which the temperature of the semiconductor substrate W falls.

The radiation thermometer 120 starts measuring the temperature when the shutter plate 21 is inserted into the light-blocking position. That is to say, the radiation thermometer 120 measures the intensity of infrared light emitted from the lower surface of the semiconductor substrate W held by the holder 7 through the opening 78 of the susceptor 74 to measure a falling temperature of the semiconductor substrate W. The measured temperature of the semiconductor substrate W is transmitted to the controller 3.

A small amount of light is continuously emitted from the halogen lamps HL that are at a high temperature immediately after switched off, but light emitted from the halogen lamps HL to the heat treatment space 65 in the chamber 6 is blocked as the radiation thermometer 120 measures the temperature of the semiconductor substrate W when the shutter plate 21 is inserted into the light-blocking position. The radiation thermometer 120 can therefore accurately measure the temperature of the semiconductor substrate W held by the susceptor 74 without being affected by ambient light.

The controller 3 monitors the temperature of the semiconductor substrate W measured by the radiation thermometer 120 to see whether the temperature has fallen to a predetermined temperature. After the temperature of the semiconductor substrate W falls to or below the predetermined temperature, the pair of transfer arms 11 of the transfer mechanism 10 horizontally moves from the withdrawal position to the transfer operation position, and moves upwards again, so that the lift pins 12 protrude from the upper surface of the susceptor 74 to receive the semiconductor substrate W after heat treatment from the susceptor 74. Then, the transportation opening 66 closed by the gate valve 85 is opened, the semiconductor substrate W placed on the lift pins 12 is transported by the transporting robot outside the apparatus (step S17), and heat treatment of the semiconductor substrate W performed by the semiconductor manufacturing apparatus 1 is completed.

In Embodiment 1, flash light is emitted from the flash lamps FL to the surface of the semiconductor substrate W on which the metal layer 114 has been formed for one second or less to momentarily raise the temperature on the surface of the semiconductor substrate W including the metal layer 114 and the impurity region 112 to the processing temperature T2 of 1000° C. or more. That is to say, the surface of the semiconductor substrate W is heated to a high temperature for an extremely short time period of one second or less by emission of flash light.

As previously described, the SiC semiconductor substrate W has been hydrogen-terminated to improve characteristics of the interface of the gate oxide film. Specifically, a defect existing in the vicinity of the interface of the gate oxide film is eliminated by hydrogen termination to improve the interface characteristics. The gate is formed in a surface region of the semiconductor substrate W other than the impurity region 112 shown in FIG. 10 in the process performed separately from the process of forming the contact shown in FIG. 9.

When the temperature of the semiconductor substrate W is raised to the high temperature by heat treatment performed for a few seconds or more to form the contact to the semiconductor substrate W as in the conventional technology, hydrogen taken in the vicinity of the interface of the above-mentioned gate oxide film can be desorbed, resulting in deterioration of the interface characteristics. When flash light is emitted from the flash lamps FL to the semiconductor substrate W for one second or less to heat the surface of the semiconductor substrate W to a temperature of 1000° C. or more for an extremely short time period as in the present embodiment, the contact can be formed by heating the metal layer 114 and the impurity region 112 while suppressing desorption of hydrogen.

In the present embodiment, heat treatment is performed by emitting flash light to the surface of the semiconductor substrate W in the forming gas atmosphere containing hydrogen. This more reliably prevents desorption of hydrogen in the vicinity of the interface of the gate oxide film during flash heating, thereby preventing deterioration of the interface characteristics.

Although the heat treatment time is short in flash heating, the temperature on the surface of the semiconductor substrate W including the metal layer 114 and the impurity region 112 is raised to a high temperature of 1000° C. or more. It is commonly known that the contact resistance decreases with increasing processing temperature in PDA for forming a contact. When the surface of the semiconductor substrate W is heated to a high temperature of 1000° C. or more by emission of flash light as in the present embodiment, a low contact resistance of $1.0 \times 10^{-6}$ $\Omega cm^2$ or less can be obtained.

As described above, in the present embodiment, flash light is emitted from the flash lamps FL to the surface of the semiconductor substrate W in the forming gas atmosphere containing hydrogen for one second or less to prevent desorption of hydrogen and to obtain a low contact resistance without deteriorating the device characteristics.

In a case of forming a p-type contact, the contact can be formed without melting the metal layer 114 by emitting flash light for one second or less even when the metal layer 114 is formed of aluminum, which is a low-melting metal.

In Embodiment 1, the metal layer is formed in step S12 without activating the impurities implanted in step S11, and the impurities implanted into the impurity region 112 are activated by heating performed by emission of flash light in step S16 at the same time as formation of the contact. This eliminates heat treatment for activating the impurities performed, in the conventional technology, before the process of forming the metal layer, and thus the manufacturing process can be simplified. When the surface of the semiconductor substrate W is heated by emission of flash light to a temperature of 1000° C. or more for an extremely short time period, unnecessary diffusion of the impurities implanted into the impurity region 112 as well as deactivation of the impurities attributable to heating performed at an approximately 1000° C. for a long time period can be prevented.

By performing flash heating for forming the contact after formation of the metal layer 114 without performing heat treatment for activating the implanted impurities as in Embodiment 1, heat treatment is performed in a state in which the surface of the impurity region 112 maintained at a high impurity concentration and the metal layer 114 are in contact with each other. FIG. 11 shows the impurity concentration in the impurity region 112 after ion implantation. In FIG. 11, the horizontal axis represents the depth of the impurity region 112 from the surface, and the vertical axis represents the impurity concentration. In FIG. 11, the depth of "0" represents the surface of the impurity region 112, and the metal layer 114 is formed on the surface so as to be in contact with the surface.

When heat treatment for activating the impurities is performed for a few seconds or more before the process of forming the metal layer as in the conventional technology, the impurity concentration decreases in the vicinity of the surface of the impurity region 112 due to out diffusion of the implanted impurities, as shown in a dashed line in FIG. 11. The Schottky barrier is more likely to appear as the impurity concentration decreases in the vicinity of the surface of the impurity region 112, preventing favorable contact formation. It is therefore necessary to introduce metal at a position deeper than the surface of the impurity region 112 in the process of forming the metal layer in the conventional technology.

In the present embodiment, heating is performed by emission of flash light after formation of the metal layer 114 without performing heat treatment for activating the implanted impurities, and thus heat treatment is performed in a state in which the metal layer 114 is in contact with the surface of the impurity region 112 that is maintained at a high impurity concentration after implantation of the impurities as shown in a solid line in FIG. 11. This allows for favorable contact formation in which the Schottky barrier does not appear.

When the ions are implanted at room temperature in the ion implanting process in step S11, recrystallization of the impurity region 112 is promoted by heating performed by emission of flash light in step S16. That is to say, crystallinity of the impurity region 112 can be destroyed when the ions are implanted at room temperature, but the destroyed crystallinity of the impurity region 112 is recrystallized by flash heating for forming a contact. In this case, the destroyed crystallinity may not completely return to an original state through recrystallization.

In the present embodiment, the lamp light emitting window 53 and the upper chamber window 63 are each formed of synthetic quartz, and flash light emitted from the flash lamps FL to the semiconductor substrate W in the chamber 6 has such spectral distribution that intensity at a wavelength of 300 nm relative to intensity at a wavelength 500 nm is 20% or more. 4H—SiC forming the semiconductor substrate W in the present embodiment has a band gap of approximately 3.2 eV, which is substantially wider than the band gap of silicon (approximately 1.1 eV). The semiconductor substrate W thus absorbs light having a short wavelength (specifically, ultraviolet light), but transmits visible light. By determining spectral distribution of flash light so that intensity at a wavelength of 300 nm relative to intensity at a wavelength of 500 nm is 20% or more, and emitting flash light containing a large amount of light in a ultraviolet region to the SiC semiconductor substrate W, flash light is absorbed by the semiconductor substrate W, which has a wide band gap, and the temperature on the surface of the semiconductor substrate W including the metal layer 114 and the impurity region 112 can be raised to the required processing temperature T2.

Embodiment 2

Figure 12:
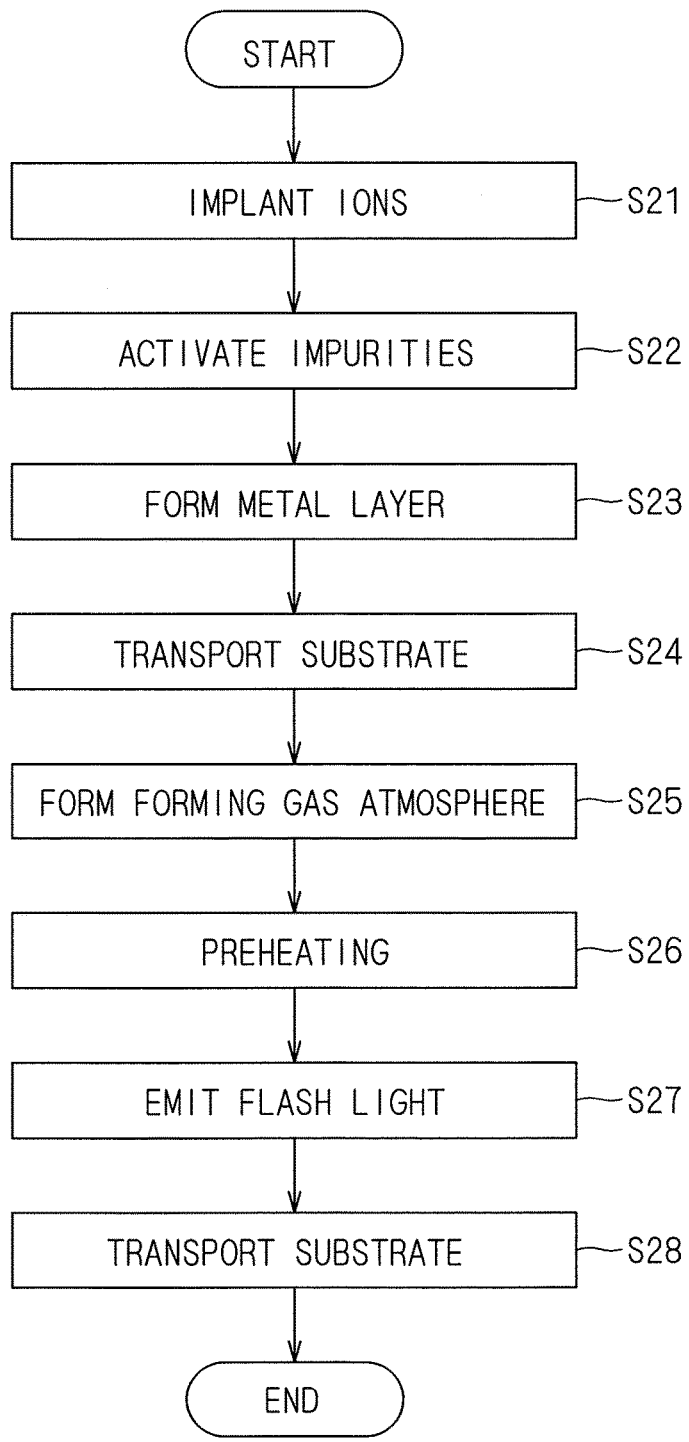
FIG. 12 is a flowchart showing the procedure for forming a contact in Embodiment 2.

Embodiment 2 of the present invention is described next. A semiconductor manufacturing apparatus in Embodiment 2 has exactly the same structure as that in Embodiment 1. The procedure performed in Embodiment 2 is substantially similar to that performed in Embodiment 1. FIG. 12 is a flowchart showing the procedure for forming a contact in Embodiment 2.

The procedure for forming the contact in Embodiment 2 is different from that in Embodiment 1 in that impurities implanted into the impurity region 112 are activated after implantation of the ions and before formation of the metal layer. First, the ion implanting process in step S21 is exactly the same as that in Embodiment 1 (step S11 in FIG. 9).

Next, in Embodiment 2, heat treatment for activating impurities implanted into the impurity region 112 in step S21 is performed (step S22). Heat treatment of the semiconductor substrate W for activating the impurities is herein performed by emitting flash light for one second or less. The method for emitting flash light to activate the impurities is the same as the method for emitting flash light described in Embodiment 1. That is to say, flash light is emitted, for one second or less, from the flash lamps FL to the surface of the semiconductor substrate W preheated to the preheating temperature T1 by emission of light from the halogen lamps HL to momentarily raise the surface temperature to the processing temperature T2. Heat treatment of the semiconductor substrate W performed by emission of flash light is performed in the forming gas atmosphere containing hydrogen. In flash heat treatment for activating the impurities, however, the preheating temperature T1 in preheating with the halogen lamps HL is 800° C., and the processing temperature T2 in emission of flash light is 1500° C.

The impurities implanted into the impurity region 112 are activated by flash heat treatment performed in step S22. The processing in steps S23 to S28 thereafter is the same as the processing in steps S12 to S17 in FIG. 9 described in Embodiment 1. That is to say, flash light is emitted to the semiconductor substrate W including the impurity region 112 on which the metal layer 114 has been formed for one second or less to form a contact.

In Embodiment 2, the impurities implanted into the impurity region 112 are activated by emitting flash light to the semiconductor substrate W for one second or less between the ion implanting process in step S21 and the metal layer forming process in step S23. With this structure, desorption of hydrogen is prevented, and a low contact resistance can be obtained without deteriorating the device characteristics as in Embodiment 1.

In Embodiment 2, since heat treatment for activating impurities is performed by emitting flash light for one second or less, out diffusion of the impurities in the impurity region 112 hardly occurs. Thus, heat treatment for forming a contact is performed in a state in which the metal layer 114 is in contact with the surface of the impurity region 112 having a high impurity concentration, allowing for favorable contact formation in which the Schottky barrier does not appear, as in Embodiment 1.

The processing to activate the impurities before formation of the metal layer may not be performed by emission of flash light but may be performed by performing heat treatment for a few seconds or more as in the conventional technology. When heat treatment is performed for a few seconds or more, however, the Schottky barrier is likely to appear during formation of the contact due to out diffusion of the impurities, and thus the heat treatment for activating the impurities is preferably performed by emission of flash light as in Embodiment 2.

Embodiment 3

Figure 13:
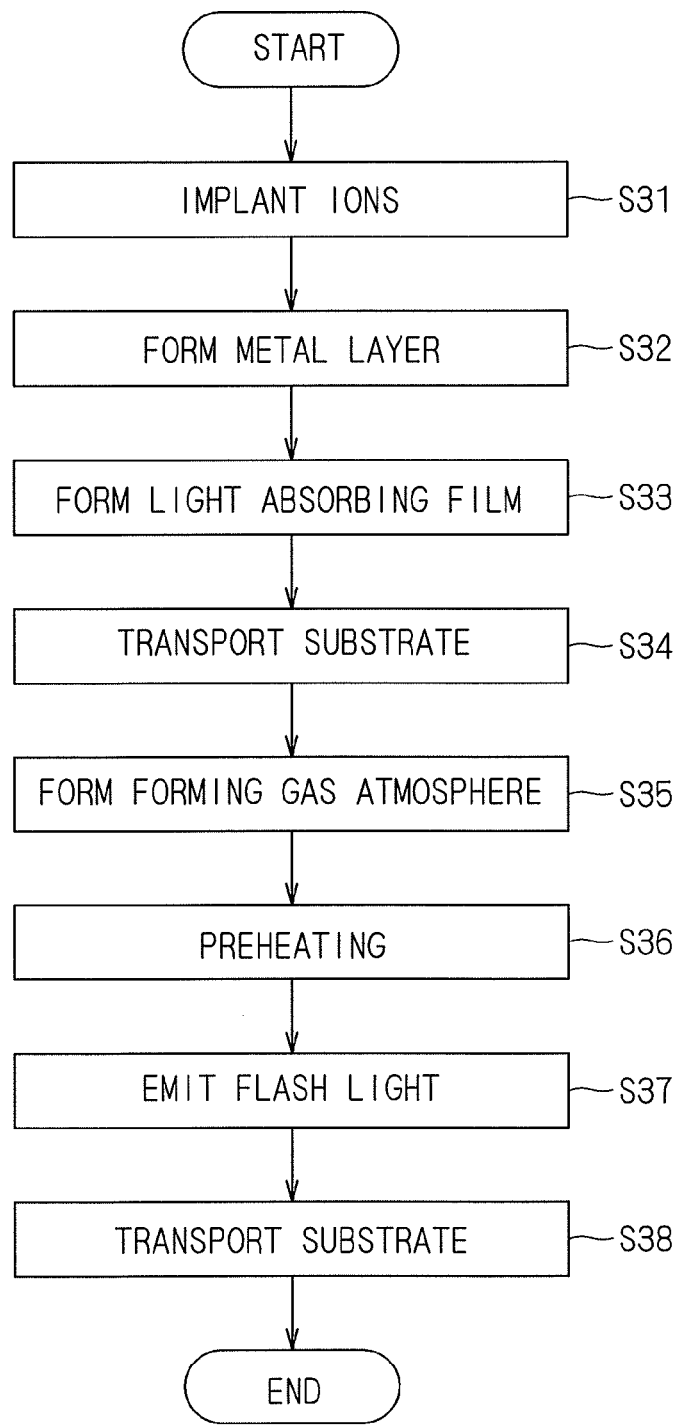
FIG. 13 is a flowchart showing the procedure for forming a contact in Embodiment 3.

Embodiment 3 of the present invention is described next. A semiconductor manufacturing apparatus in Embodiment 3 has exactly the same structure as that in Embodiment 1. The procedure performed in Embodiment 3 is substantially similar to that performed in Embodiment 1. FIG. 13 is a flowchart showing the procedure for forming a contact in Embodiment 3.

The procedure for forming the contact in Embodiment 3 is different from that in Embodiment 1 in that, after formation of the metal layer 114, a light absorbing film is further formed on the metal layer 114. First, the ion implanting process in step S31 and the metal layer forming process in step S32 are exactly the same as those in Embodiment 1 (steps S11 and S12 in FIG. 9).

Figure 14:
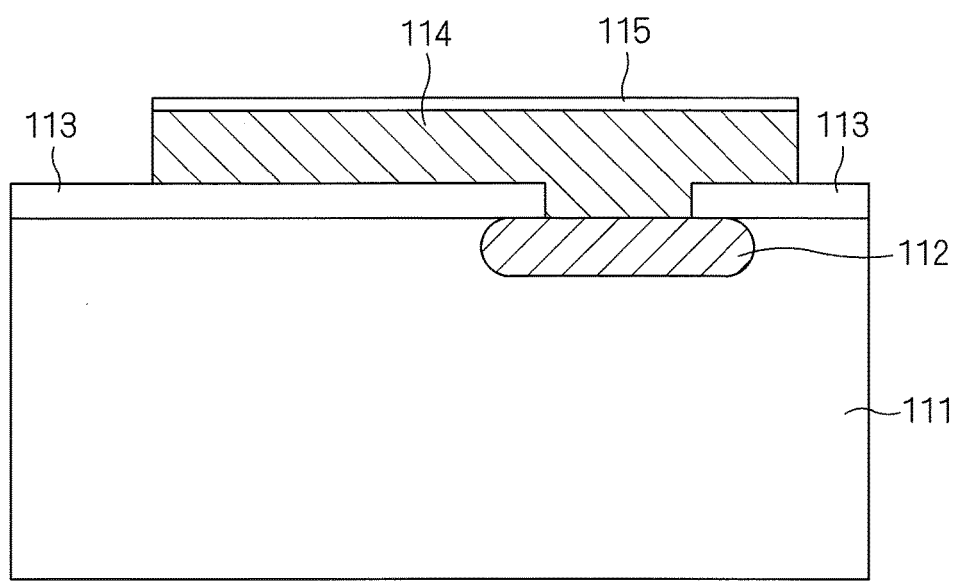
FIG. 14 shows a surface structure of the semiconductor substrate on which the metal layer covered with a light absorbing film has been formed.

In Embodiment 3, the light absorbing film is formed on the metal layer 114 after formation of the metal layer 114 and before heat treatment for forming a contact (step S33). FIG. 14 shows a surface structure of the semiconductor substrate W on which the metal layer covered with the light absorbing film has been formed. In FIG. 14, the same elements as those in FIG. 10 bear the same reference signs.

In Embodiment 3, the metal layer 114 is formed on the impurity region 112, and the light absorbing film 115 is further formed on the metal layer 114. An example of the light absorbing film 115 is a film formed of carbon (C) or titanium nitride (TiN). The light absorbing film 115 is formed on the metal layer 114 by deposition, for example.

The processing in steps S34 to S38 after formation of the light absorbing film is the same as the processing in steps S13 to S17 in FIG. 9 described in Embodiment 1. That is to say, flash light is emitted to the semiconductor substrate W in the forming gas atmosphere containing hydrogen for one second or less to form a contact.

In Embodiment 3, the light absorbing film 115 is formed on the metal layer 114 before heat treatment for forming a contact. The light absorbing film 115 has a higher absorption rate of flash light than the metal layer 114. As a result, when flash light is emitted from the flash lamps FL, the metal layer 114 and the impurity region 112 can be heated to a higher temperature, and the contact resistance can further be reduced. Effects other than the effects obtained by the light absorbing film 115 are similar to those obtained in Embodiment 1.

In Embodiment 3, cleaning for eliminating the light absorbing film 115 from the metal layer 114 may be performed after flash heating.

Embodiment 4

Embodiment 4 of the present invention is described next. A semiconductor manufacturing apparatus in Embodiment 4 has exactly the same structure as that in Embodiment 1. The procedure performed in Embodiment 4 is substantially similar to that performed in Embodiment 1. Embodiment 4 is different from Embodiment 1 in that a p-type contact and an n-type contact are formed simultaneously in one side of the semiconductor substrate W.

In the ion implanting process in Embodiment 4 (step S11 in FIG. 9), an n-type impurity region and a p-type impurity region are formed in one side of the semiconductor substrate W. Specifically, aluminum ions are implanted into a region of the one side of the semiconductor substrate W to form the p-type impurity region, and phosphorus ions are implanted into a region, other than the region implanted with the aluminum ions, of the one side of the semiconductor substrate W to form the n-type impurity region.

In the metal layer forming process in Embodiment 4 (step S12 in step 9), a metal layer formed of aluminum is formed on the p-type impurity region formed in the one side of the above-mentioned semiconductor substrate W, and a metal layer formed of nickel is formed on the n-type impurity region formed in the one side of the above-mentioned semiconductor substrate W. The above-mentioned semiconductor substrate W is transported into the semiconductor manufacturing apparatus 1, and heat treatment is performed by emitting flash light from the flash lamps FL. The procedure for performing flash heat treatment is the same as the procedure in steps S13 to S17 in FIG. 9.

In Embodiment 4, the p-type contact and the n-type contact are formed collectively and simultaneously by emitting flash light from the flash lamps FL to the one side of the above-mentioned semiconductor substrate W for one second or less. That is to say, the p-type contact is formed by heating the aluminum layer and the p-type impurity region, and the n-type contact is formed by heating the nickel layer and the n-type impurity region through emission of flash light at the same time.

The manufacturing process can be simplified if the p-type contact and the n-type contact can be formed simultaneously as described above. Aluminum for the p-type contact is a lower-melting metal than nickel for the n-type contact. When a time for which flash light is emitted is one second or less, however, the p-type contact can be formed in a similar manner to the n-type contact without melting the metal layer formed of aluminum, or without causing the metal layer to disappear by melting in a short time period.

<Modifications>

Although the embodiments of the present invention have been described so far, various modifications other than those described above can be made to the present invention unless they depart from the gist of the present invention. For example, in Embodiment 1 described above, the lamp light emitting window 53 and the upper chamber window 63, which transmit flash light from the flash lamps FL, are formed of synthetic quartz, so that flash light emitted to the semiconductor substrate W formed of SiC having a wide band gap contains a large amount of light in the ultraviolet region. The method for increasing components in the ultraviolet region, however, is not limited to this method. For example, the components in the ultraviolet region of the flash light to be emitted may be increased by adjusting the structure of the flash lamps FL themselves (e.g., composition and pressure of filling gas) or the light emitting time. Any methods may be used as long as flash light emitted to the semiconductor substrate W has such spectral distribution that intensity at a wavelength of 300 nm relative to intensity at a wavelength of 500 nm is 20% or more.

In each of the above-mentioned embodiments, light emitting pattern of the flash lamps FL can freely be defined by the IGBT 96 intermitting supply of charge to the flash lamps FL. An appropriate light emitting pattern may thus be used to cause the flash lamps FL to emit light in accordance with the composition and the like of metal forming the metal layer.

In each of the above-mentioned embodiments, flash light is emitted from the flash lamps FL to the surface of the semiconductor substrate W for one second or less. A light source, however, is not limited to the flash lamps FL as long as it can emit light for an extremely short time period of one second or less, and, for example, a laser light source may be used in place of the flash lamps FL. The laser light source can typically emit light for a shorter time period than the flash lamps FL, and heat treatment may be performed by emitting laser light from the laser light source to the surface of the semiconductor substrate W for one second or less.

In each of the above-mentioned embodiments, the flash heater 5 includes 30 flash lamps FL. The number of flash lamps FL, however, is not limited to 30, and may be any number. The flash lamps FL are not limited to the xenon flash lamps, and may be krypton flash lamps. The number of halogen lamps HL included in the halogen heater 4 is also not limited to 40, and may be any number.

The technology according to the present invention is not limited to contact formation to the SiC semiconductor substrate W, and is applicable to contact formation to an Si semiconductor substrate. This means that the present invention is applicable to contact formation to a semiconductor substrate, and is, in particular, suitable for contact formation to an SiC semiconductor manufacturing apparatus.

While the invention has been shown and described in detail, the foregoing description is in all aspects illustrative and not restrictive. It is therefore understood that numerous modifications and variations can be devised without departing from the scope of the invention.

What is claimed is:

1. A semiconductor manufacturing method for forming a contact to a semiconductor substrate formed of silicon carbide, a gate oxide film of said semiconductor substrate being hydrogen-terminated, the method comprising the steps of:
   (a) implanting ions into a region of the semiconductor substrate to form an impurity region;
   (b) forming a metal layer on said impurity region, the metal layer not containing silicon; and
   (c) emitting light to said semiconductor substrate on which said metal layer has been formed for one second or less for heating, wherein
   said step (c) is performed in a forming gas atmosphere containing hydrogen, to heat said semiconductor substrate without desorbing hydrogen from a vicinity of an interface of said gate oxide film of said semiconductor substrate.

2. The semiconductor manufacturing method according to claim 1, wherein
   when the light is emitted in said step (c), a surface of said semiconductor substrate reaches a temperature of 1000° C. or more.

3. The semiconductor manufacturing method according to claim 1, wherein
   in said step (c), the contact is formed, and impurities implanted into said impurity region are activated.

4. The semiconductor manufacturing method according to claim 3, wherein
   in said step (c), recrystallization of said impurity region is promoted.

5. The semiconductor manufacturing method according to claim 1, further comprising the step of
   between said steps (a) and (b), emitting light to said semiconductor substrate for one second or less to activate impurities implanted into said impurity region.

6. The semiconductor manufacturing method according to claim 1, wherein
   in said step (c), the light emitted to said semiconductor substrate has such spectral distribution that intensity at a wavelength of 300 nm relative to intensity at a wavelength of 500 nm is 20% or more.

7. The semiconductor manufacturing method according to claim 1, further comprising the step of
   before said step (c), forming a light absorbing film on said metal layer.

8. The semiconductor manufacturing method according to claim 1, wherein
   in said step (a), a n-type impurity region and a p-type impurity region are formed in one side of said semiconductor substrate,
   in said step (b), a nickel layer is formed on said n-type impurity region, and an aluminum layer is formed on said p-type impurity region, and
   in said step (c), the light is emitted to said one side of said semiconductor substrate to form a n-type contact and a p-type contact simultaneously.

9. The semiconductor manufacturing method according to claim 1, wherein
   in said step (c), flash light is emitted from a flash lamp to said semiconductor substrate.

10. The semiconductor manufacturing method according to claim 1, wherein when said impurity region is a p-type region, aluminum ions are implanted into said region of the semiconductor substrate, and when said impurity region is a n-type region, phosphorus ions are implanted into said region of the semiconductor substrate.

* * * * *